United States Patent [19]

Kuhlmann-Schäfer

[11] 3,960,511

[45] June 1, 1976

[54] ZONE MELTING PROCESS

[75] Inventor: Wilhelm H. Kuhlmann-Schäfer, Hannover, Germany

[73] Assignee: Preussag Aktiengesellschaft, Germany

[22] Filed: Aug. 5, 1974

[21] Appl. No.: 494,979

Related U.S. Application Data

[63] Continuation of Ser. No. 270,695, July 11, 1972, abandoned.

[30] Foreign Application Priority Data

July 15, 1971 Germany............................ 2135306

[52] U.S. Cl............................................. 23/301 SP
[51] Int. Cl.².......................................... B01J 17/18
[58] Field of Search............ 23/273 SP, 301 SP, 305

[56] References Cited
UNITED STATES PATENTS 3,224,844  12/1965  Gerthsen......................... 23/273 SP
3,505,032  4/1970  Bennett........................... 23/301 SP
3,663,180  5/1972  Brissot............................ 23/301 SP

FOREIGN PATENTS OR APPLICATIONS 1,154,950  9/1963  Germany......................... 23/273 SP
967,844  8/1964  United Kingdom............. 23/301 SP Primary Examiner—Jack Sofer
Attorney, Agent, or Firm—Allegretti, Newitt, Witcoff & McAndrews

[57] ABSTRACT

In a zone melting process, current is passed transversely through the process charge by electrodes arranged laterally of the charge consisting of the charge material and having a height corresponding substantially to the height of the melting zone in the direction of pulling.

7 Claims, 5 Drawing Figures

ZONE MELTING PROCESS

This is a continuation of application Ser. No. 270,695, filed July 11, 1972, now abandoned.

BACKGROUND OF THE INVENTION

The invention relates to a zone melting process wherein a charge is heated by an electrical current conducted through the charge.

In German Pat. No. 1,169,683 there is described a process for the zone melting of a semiconductor rod without the use of a crucible or boat wherein the molten zone is produced by a radiant energy source directed at right angles to the axis of the semiconductor rod. The energy source surrounds the rod concentrically and an approximately level course is produced for the boundaries between the molten zone and the solid semiconductor material supporting it. In addition, heating of the semiconductor rod is performed by a current flowing through the rod in a longitudinal direction. In this manner, it is intended to achieve a general, preferably uniform, heating so that the temperature achieved by this heating is below the melting point of the rod. The object of this known process is the production of a boundary between the liquid and the solid phases as level as possible. However, because of the particular way in which heat is supplied to the melting zone, the expense required is considered. Furthermore, difficulties arise if the surface tension of the molten material is not maintained at an adequate level. Finally, the energy expenditure and investment costs are high and the process, in general, is relatively uneconomical.

An older German Pat. application P 21 25 726.1 discloses a zone melting process wherein an elongated charge of melted material has a temperature above the melting point of the material in a zone migrating in the direction of the longitudinal direction of the charge. After the migrating zone, the material has a temperature at least below the melting point of the material. A particular feature of this known process is that the current flowing longitudinally through the charge is capable of heating the charge to a temperature above the melting point. Further, the charge, at least in the region positioned after the zone, in the direction of travel of the charge, is cooled to a temperature below the melting point. In this way, the introduction of energy for producing and maintaining the melting zone is not necessary, as was the case with the process of the 1,169,683 Pat. Specification. In the older process, the current heats the charge in the region of the melting zone above the melting point and, outside the melting zone, suitable cooling is provided to ensure that the liquid phase merges into the solid phase, or that the charge remains unmelted. This process, since only one heat source is required and the cooling effect can be readily achieved e.g. by radiation and/or by air, affords a great simplicity as regards the arrangement for carrying out the process, and is very economical. However, difficulties may result in melting materials having inadequate surface tension since a certain surface tension is required to hold the material together in the melting zone.

The known Verneuil process permits the growing of crystals from materials of low surface tension, since the liquid layer formed on the drawn crystal rod on which particles are deposited can be kept very thin, so that there is no risk that the liquid will flow away laterally. Preferably, material from which the rod is grown is in the liquid state.

A modification of the Czochralski method is known wherein the tip of a finished rod is melted and the crystal is pulled from the resultant melt. With this method, also known as the "pedestal-growth" method, it is possible for outflow to occur if the liquid in the melting zone is of low surface tension. Therefore, this method is suitable only for materials of adequate surface tension.

SUMMARY OF THE INVENTION

The object of this invention is to provide a zone melting process which permits the pulling of crystals of great purity, even when using materials of low surface tension, operates without the use of a crucible, and is economical.

The object of the invention is achieved by passing current transversely through the charge by means of electrodes arranged laterally of the charge. The electrodes also consist of the charge material, and have a height corresponding substantially to the height of the melting zone in the pulling direction.

DESCRIPTION OF PREFERRED EMBODIMENTS

With the process of the present invention, the laterally arranged electrodes, consisting of the same material as the charge and preferably of the same purity as the crystal to be produced, insure that the liquid cannot substantially escape from the melting zone even with a material of low surface tension. The electrodes may be cooled, so that they are not substantially consumed. In some circumstances it may be sufficient simply to provide a fixed arrangement. The direct introduction of heat in the region of the melting zone results in a more economical procedure. In addition, the arrangement for carrying out the process is very simple, so that the installation costs are low.

A further development of the process of the present invention consists in that the charge is a rod on which the electrodes abut and the electrodes are moved downwards in accordance with the speed of migration of the melting zone. Thus, the present invention differs from the known zone melting process in that the melting zone is enclosed and it is possible to use materials of low surface tension. The electrodes can engage about the rod on all sides and, for this purpose, may be somewhat recessed in accordance with the cross-sectional form of the rod. The electrodes may also be elongated in the horizontal direction so that a plate is produced whose edges are sufficiently held together in the region of the melting zone if low surface tension is present.

Another further development of the present invention consists in that the electrodes are rod-shaped and are moved towards one another in the horizontal direction. In the zone where the two rod-shaped electrodes encounter each other, the melting zone is situated, and a crystal is drawn upwards in a manner known in the art. In this embodiment, the usual rod in zone melting processes is divided into substantially two rods and these form the electrodes and continually feed-in new material at the same time, i.e. are consumed.

It is convenient to select the speed of pulling or drawing of the crystal so that the cross-section of the melting zone is smaller than the cross-section of the rod-shaped electrodes. In this way, it is guaranteed that in the melting zone, a reduced cross-section is obtained for the current flow and, correspondingly, an increased heat production results precisely in this region where the maximum temperature is necessary.

A further development of the invention consists in that below the melting zone, a sintered rod, preferably of high porosity and made of the same material as the rod-shaped electrodes, is held for supporting the melting zone and is moved upwards in accordance with the speed of its melting below the melting zone. In this way, even with the relative extent of the melting zone in a horizontal direction, outflow or dripping of the melt in a downward direction is prevented. This possible procedure provides, in a general sense, for substantially introducing or arranging rods from a direction other than the electrode directions into the melting zone. The speed of movement of these rods depends on their consumption, and in some cases they may be stationary.

Finally, it is convenient to make the electrodes taper towards the melting zone. This feature contributes to producing the most heat actually in the melting zone, whereas only a small proportion is in the rod-shaped electrodes themselves.

BRIEF DESCRIPTION OF DRAWINGS

The invention will be explained in detail hereinafter with the aid of the drawings attached hereto.

DETAILED DESCRIPTION OF DRAWINGS

Figure 1:
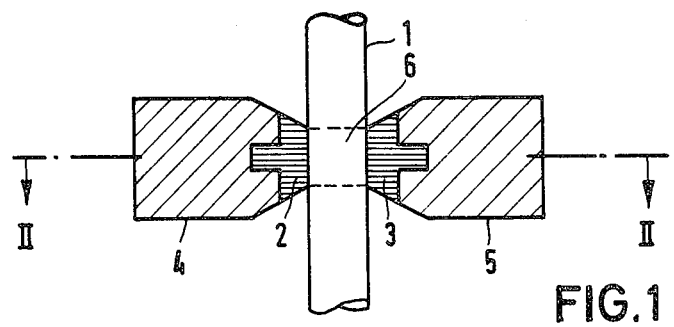
FIG. 1 shows in section an apparatus for carrying the process of the present invention.

In FIG. 1, electrodes 2 and 3 are contained in electrode holders 4 and 5 and abut on a rod-shaped charge 1. The electrodes 2 and 3 are connected by the electrode holders 4 and 5, in a manner not shown, to a current source which sends a current through a melting zone 6 of the charge 1.

Figure 2:
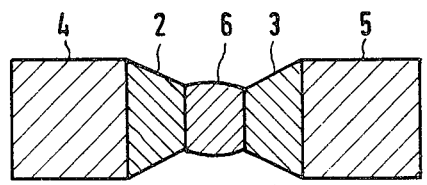
FIG. 2 is a section of FIG. 1, taken along section line II-II.

As shown in greater detail in the sectional view of FIG. 2, the cross-section of the melting zone 6 is smaller than the cross-section of the electrodes 2 and 3, or the electrode holders 4 and 5. Thus, the most heat is produced in the melting zone 6. This is also true with most materials since, with many materials, the resistance increases on change to the liquid phase. As a result, stable conditions are obtained. A sudden and considerable widening of the cross-section of the electrodes 2 and 3 avoids excessive production of heat in the electrodes 2 and 3.

The electrodes 2 and 3 enclose the liquid of the melting zone 6, at least in the abutment region, so that even with a low surface tension the material is prevented from flowing away or dripping out. In principle, it is also possible to provide a further pair of electrodes offset by 90° relative to the electrodes 2 and 3, so that the melting zone is enclosed on all sides by electrodes. When activating such electrode systems with three-phase current, it is also possible to obtain good mixing in the melting zone. When a three-phase current is used, it is introduced by at least three electrodes positioned at the same angular spacing from one another.

The electrodes 2 and 3 move in the manner known to the art from zone melting, relative to the charge 1, so that the melting zone 6 travels through the charge 1.

Figures 3A, 3B:
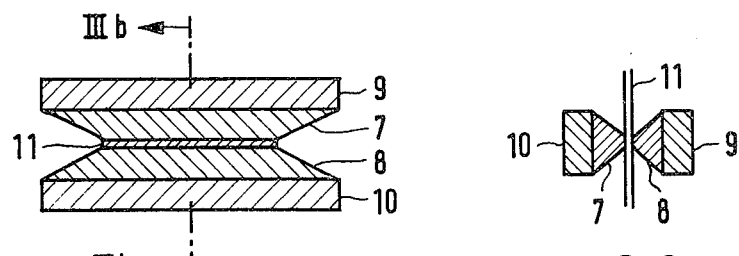
FIG. 3a and FIG. 3b show, in horizontal section and in cross-section respectively, an apparatus for carrying out the process of the invention substantially in accordance with FIGS. 1 and 2, but embodying electrodes of wide construction.

FIG. 3a corresponds in principle to the view shown in FIG. 2 but it shows another form of electrode. Here, electrodes 7 and 8 are held by electrode holders 9 and 10 and are elongated in a horizontal direction substantially transversely to the direction of flow, i.e. they are substantially longer than they are high. Correspondingly, a plate-form charge 11 is positioned between electrodes 7 and 8.

FIG. 3b is a vertical section taken along section line IIIb—IIIb of FIG. 3a and shows the small vertical extend of the melting zone in comparison with its horizontal extent.

Figure 4:
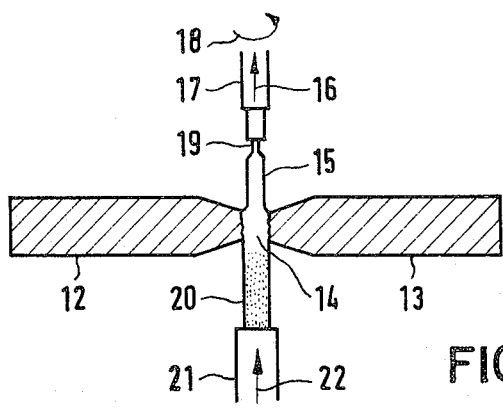
FIG. 4 shows an apparatus for carrying out the process of the present invention with rod-shaped electrodes.

In FIG. 4, two rod-shaped electrodes 12 and 13 are provided which consist, over their entire length, apart from a melting zone 14 of the material from which a crystal is to be drawn. The electrodes narrow towards the melting zone 14 and conduct electricity through this zone since they are connected to a suitable current source. The current created causes the material in the melting zone 14 to melt.

From the melting zone 14, a rod-shaped crystal body 15 is drawn in a manner known to the art, at a sufficient velocity so that, as the material taken from the melting zone 14, the melting zone has a smaller cross-section relative to the cross-section of the electrodes 12 and 13. This produces the greatest quantity of heat in the melting zone and stable conditions are provided. The material thus taken from the melting zone 14 is replaced by feeding-in the rod-shaped electrodes 12 and 13. The feed velocity for the electrodes 12 and 13 also determines the cross-section of the melting zone for the electric current, so that the feed velocity for the electrodes 12 and 13 and the pulling speed for the crystal body 15 in the upward direction as shown by the arrow 16 have to be correlated to one another. To level the drawn crystal body 15, an additional holder 17 can turn about its axis in the direction of arrow 18 together with the crystal body. Furthermore, in a known manner, the beginning of the pulling can be effected by means of a monocrystal 19, so that the rod-shaped crystal body 15 is produced as a single crystal.

Below the melting zone 14 there is positioned on a support 21, a sintered rod 20 which has a high degree of porosity, so that the coefficient of thermal conduction of the rod is low. This rod forms the lower boundary of the melting zone 14 and thus ensures that even in extreme cases no liquid can escape from the melting zone 14. The rod 20 consists of the same material as the crystal body 15 and, like the electrodes 12 and 13, has the highest possible degree of purity.

When the rod is slowly consumed through melting at the top of the rod in the region of melting zone 14, the support 21 is moved upwards in the direction of an arrow 22 and the liquified material of the rod 20 is thus replaced by feeding-in. It is also possible to introduce material only through the sintered rod, in which case the electrodes are substantially stationary and are not consumed.

I claim as my invention:

1. A Process of zone melting a charge utilizing at least a pair of solid, spaced electrodes each having a tapered end and means for producing a current in said electrodes, said charge and electrode tapered ends being of substantially the same material, comprising the steps of:
placing said tapered ends of said pair of electrodes in lateral, waxial, direct physical contact with the perimeter of said charge, said charge separating said electrodes;
then passing said current between said electrodes and transversely through said charge to resistantly heat said charge and melt a zone therein, said current passing solely through said zone between said electrodes;
enclosing at least a portion of said charge with said electrodes to support and maintain said zone; and
moving said charge relative to said electrodes at a predetermined velocity, said zone migrating longitudinally through said charge at said predetermined velocity.

2. A process as claimed in claim 1 wherein said electrodes are tapered toward said zone.

3. A process as claimed in claim 1 further comprising the steps of laterally moving said electrode means toward said zone and consuming said electrode means in the drawing of said crystal.

4. A process as claimed in claim 1 wherein said current is three-phase.

5. A process as claimed in claim 4 wherein said process utilizes three electrodes positioned at substantially the same angular spacing from one another.

6. A process as claimed in claim 1 further comprising the step of drawing a crystal from said zone.

7. A process as claimed in claim 6 wherein the velocity at which said crystal is drawn is calibrated so that the cross-sectional area of said zone is smaller than that of said electrodes at their maximum cross-sectional areas.

* * * * *